US012635159B2

(12) United States Patent
Shih et al.

(10) Patent No.: US 12,635,159 B2
(45) Date of Patent: May 19, 2026

(54) STACKED MULTI-GATE DEVICE WITH BARRIER LAYERS

(71) Applicant: Taiwan Semiconductor Manufacturing Company, Ltd., Hsin-Chu (TW)

(72) Inventors: Che Chi Shih, Taoyuan (TW); Chia-Hao Yu, New Taipei (TW); Wei-Yen Woon, Taoyuan (TW); Szuya Liao, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 440 days.

(21) Appl. No.: 18/462,534

(22) Filed: Sep. 7, 2023

(65) Prior Publication Data

US 2024/0321990 A1 Sep. 26, 2024

Related U.S. Application Data

(60) Provisional application No. 63/492,160, filed on Mar. 24, 2023.

(51) Int. Cl.
H10D 30/01 (2025.01)
H10D 30/43 (2025.01)
(Continued)

(52) U.S. Cl.
CPC ......... H10D 30/017 (2025.01); H10D 30/014 (2025.01); H10D 30/43 (2025.01); (Continued)

(58) Field of Classification Search
CPC .... H10D 30/01; H10D 30/014; H10D 30/017; H10D 30/019–0198; H10D 30/0273; (Continued)

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| | (Continued) | |

FOREIGN PATENT DOCUMENTS

| | | |
|---|---|---|
| KR | 20220057414 A | 5/2022 |
| TW | 202202440 A | 1/2022 |
| | (Continued) | |

OTHER PUBLICATIONS

Zheng, et al. "Fluorinated Graphene in Interface Engineering of Ge-Based Nanoelectronics." Advanced Functional Materials 25.12 (2015): 1805-1813.

*Primary Examiner* — Cheung Lee
(74) *Attorney, Agent, or Firm* — HAYNES AND BOONE, LLP

(57) ABSTRACT

Semiconductor structures and methods of forming the same are provided. An exemplary method includes forming a stack over a substrate and patterning the stack and a portion of the substrate to form a fin-shaped structure comprising a base portion formed from the substrate and a top portion formed from the stack. The stack includes channel layers interleaved by sacrificial layers and two-dimensional (2D) material layers disposed between adjacent ones of the channel layers and the sacrificial layers. The method also includes selectively removing the sacrificial layers of the top portion to form a plurality of channel members disposed over the base portion, forming a first gate structure and a second gate structure above the first gate structure. The first gate structure wraps around a bottom portion of the channel members. The second gate structure wraps around a top portion of the channel members.

20 Claims, 12 Drawing Sheets

(51) Int. Cl.

| | |
|---|---|
| *H10D 30/67* | (2025.01) |
| *H10D 62/10* | (2025.01) |
| *H10D 62/84* | (2025.01) |
| *H10D 64/01* | (2025.01) |
| *H10D 84/01* | (2025.01) |
| *H10D 84/03* | (2025.01) |
| *H10D 84/85* | (2025.01) |

(52) U.S. Cl.
CPC ..... *H10D 30/6735* (2025.01); *H10D 30/6757* (2025.01); *H10D 62/121* (2025.01); *H10D 62/84* (2025.01); *H10D 64/017* (2025.01); *H10D 84/0167* (2025.01); *H10D 84/038* (2025.01); *H10D 84/85* (2025.01)

(58) Field of Classification Search
CPC .. H10D 30/031; H10D 30/0323; H10D 30/43; H10D 30/435; H10D 30/501–509; H10D 30/6735; H10D 30/674; H10D 30/6757; H10D 62/121; H10D 62/84; H10D 64/017; H10D 84/01; H10D 84/0165; H10D 84/0167; H10D 84/0172; H10D 84/0193; H10D 84/038; H10D 84/8311; H10D 84/8312; H10D 84/83135; H10D 84/83138; H10D 84/8314; H10D 84/8316; H10D 84/835; H10D 84/836; H10D 84/837–839; H10D 84/85; H10D 84/851–852; H10D 84/853; H10D 84/856
See application file for complete search history.

(56) References Cited

U.S. PATENT DOCUMENTS

| | | | |
|---|---|---|---|
| 8,816,444 | B2 | 8/2014 | Wann et al. |
| 8,823,065 | B2 | 9/2014 | Wang et al. |
| 8,860,148 | B2 | 10/2014 | Hu et al. |
| 9,105,490 | B2 | 8/2015 | Wang et al. |
| 9,236,267 | B2 | 1/2016 | De et al. |
| 9,236,300 | B2 | 1/2016 | Liaw |
| 9,520,482 | B1 | 12/2016 | Chang et al. |
| 9,576,814 | B2 | 2/2017 | Wu et al. |
| 11,069,684 | B1 | 7/2021 | Xie |
| 11,158,544 | B2* | 10/2021 | Cheng ................. H10D 62/121 |
| 2020/0403034 | A1 | 12/2020 | Ando |
| 2021/0265345 | A1 | 8/2021 | Xie |
| 2022/0140098 | A1 | 5/2022 | Cheng et al. |
| 2022/0359660 | A1 | 11/2022 | Khaderbad et al. |
| 2023/0008409 | A1 | 1/2023 | Chou et al. |
| 2023/0062389 | A1 | 3/2023 | Shen et al. |
| 2023/0067715 | A1 | 3/2023 | Yuh |
| 2023/0089395 | A1 | 3/2023 | Orr |

FOREIGN PATENT DOCUMENTS

| | | |
|---|---|---|
| TW | 202245235 A | 11/2022 |
| TW | 202304806 A | 2/2023 |

* cited by examiner

100

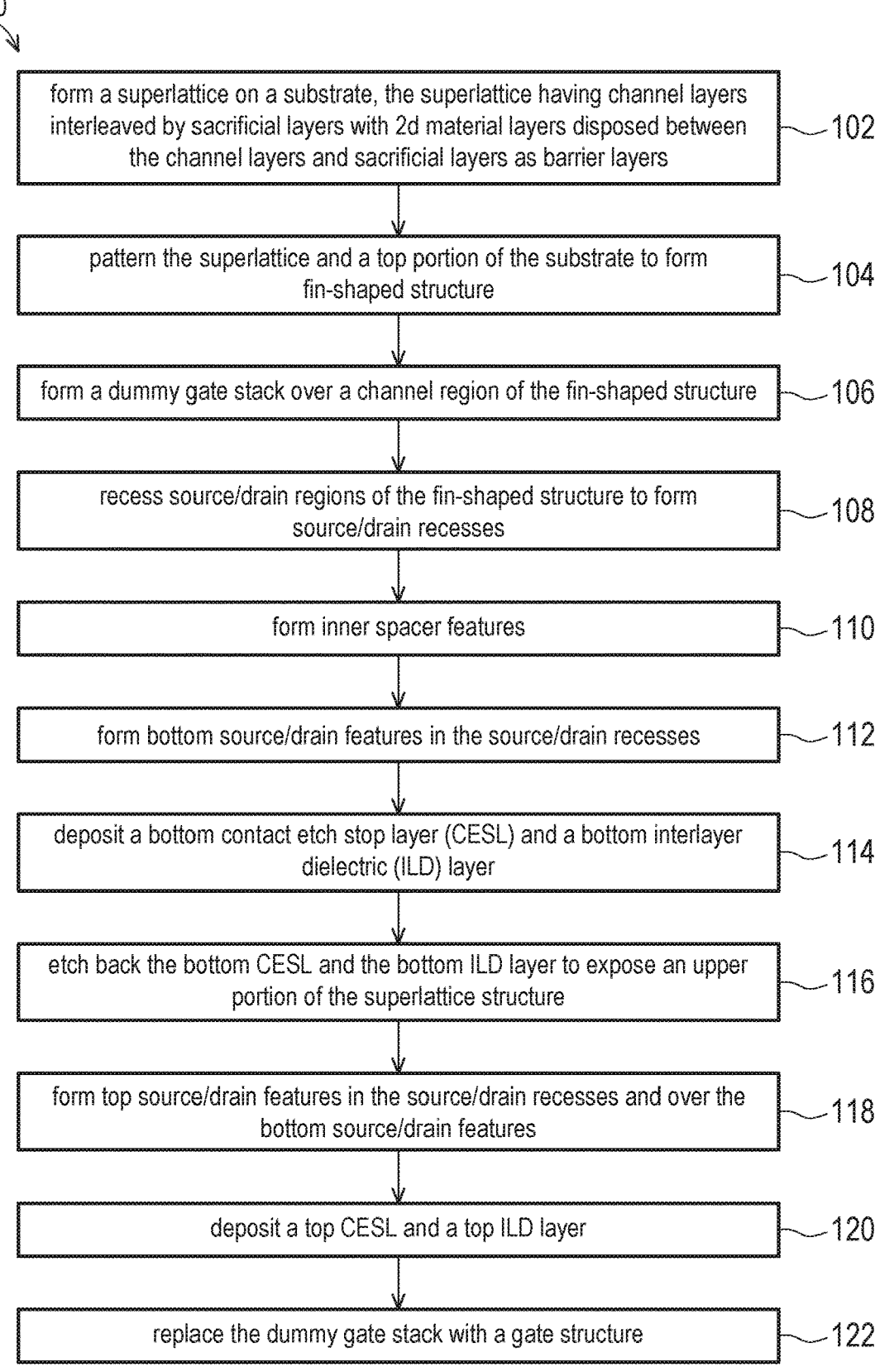

form a superlattice on a substrate, the superlattice having channel layers interleaved by sacrificial layers with 2d material layers disposed between the channel layers and sacrificial layers as barrier layers — 102 pattern the superlattice and a top portion of the substrate to form fin-shaped structure — 104 form a dummy gate stack over a channel region of the fin-shaped structure — 106 recess source/drain regions of the fin-shaped structure to form source/drain recesses — 108 form inner spacer features — 110 form bottom source/drain features in the source/drain recesses — 112 deposit a bottom contact etch stop layer (CESL) and a bottom interlayer dielectric (ILD) layer — 114 etch back the bottom CESL and the bottom ILD layer to expose an upper portion of the superlattice structure — 116 form top source/drain features in the source/drain recesses and over the bottom source/drain features — 118 deposit a top CESL and a top ILD layer — 120 replace the dummy gate stack with a gate structure — 122

FIG. 2

STACKED MULTI-GATE DEVICE WITH BARRIER LAYERS

PRIORITY DATA

The present application claims the benefit of U.S. Provisional Application No. 63/492,160, filed on Mar. 24, 2023, which is incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs. For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, other nanostructures, and/or other suitable structures. The shapes of the channel region have also given an MBC transistor alternative names such as a nanosheet transistor or a nanowire transistor.

As the semiconductor industry further progresses into sub-10 nanometer (nm) technology process nodes in pursuit of higher device density, higher performance, and lower costs, challenges from both fabrication and design issues have led to stacked device structure configurations, such as complementary field effect transistors (C-FETs) where an n-type multi-gate transistor and a p-type multi-gate transistor are stacked vertically, one over the other. However, with continuous shrinking dimensions, even this new device structure faces new challenges.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 2 illustrates a flow chart of a method for forming a semiconductor device including a vertical C-FET, according to one or more aspects of the present disclosure.

DETAILED DESCRIPTION

Figure 1:
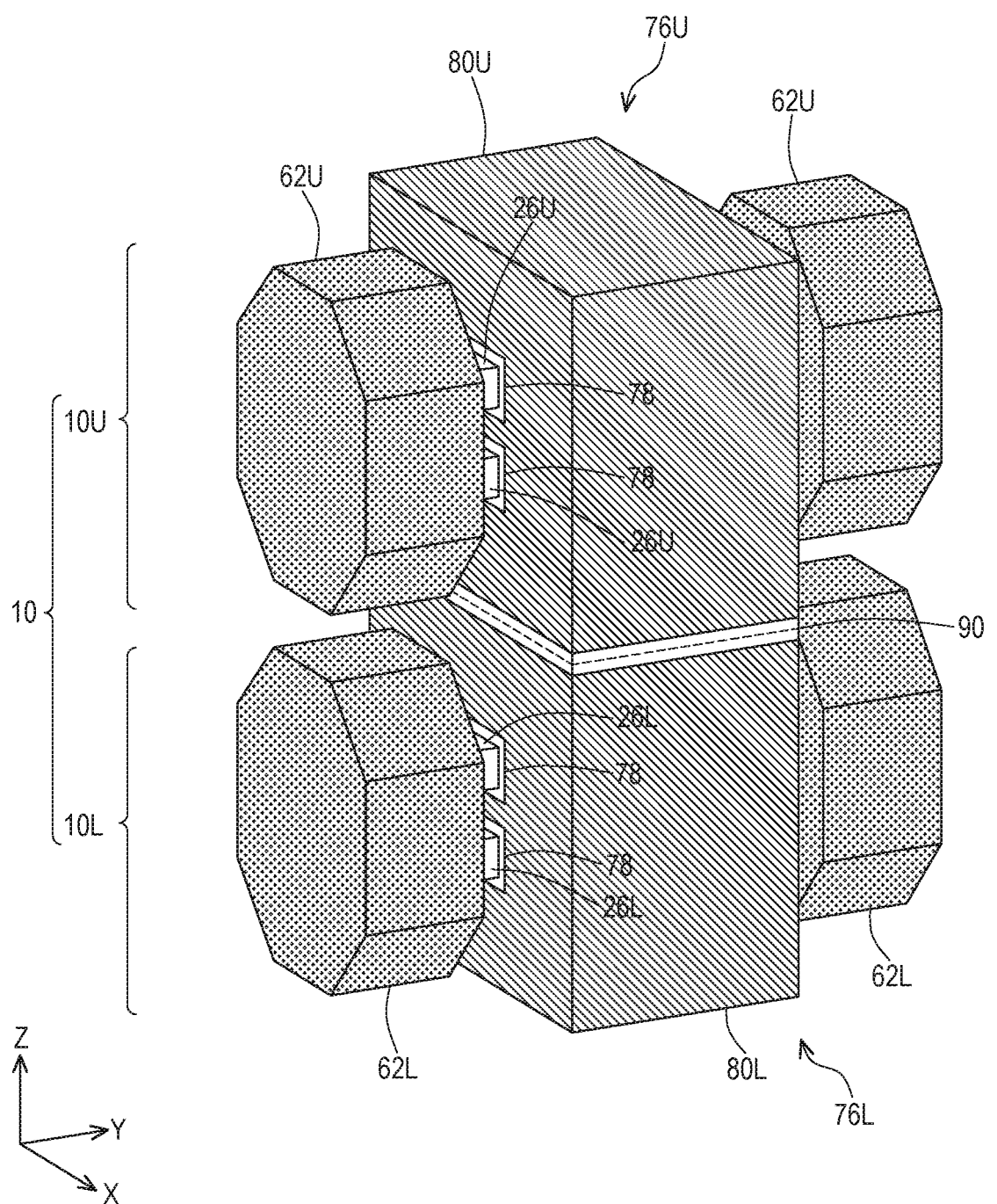
FIG. 1 illustrates a perspective view of a semiconductor device including a vertical C-FET, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact.

Spatially relative terms, such as "beneath," "below." "lower," "above." "upper" and the like, may be used herein for case of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Source/drain(s) may refer to a source or a drain, individually or collectively dependent upon the context. Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.5 nm to 5.5 nm where manufacturing tolerances associated with depositing the material layer are known to be +/−10% by one of ordinary skill in the art. Still further, throughout the present application and across different embodiments, like reference numerals denote like features with similar structures and compositions, unless otherwise excepted. For avoidance of doubts, the X, Y and Z directions in the figures are perpendicular to one another and are used consistently.

A stacked multi-gate device refers to a semiconductor device that includes a bottom multi-gate device and a top multi-gate device stacked over the bottom multi-gate device.

When the bottom multi-gate device and the top multi-gate device are of different conductivity types, the stacked multi-gate device may be a complementary field effect transistor (C-FET). The multi-gate devices in a C-FET may be MBC transistors.

FIG. 1 depicts an exemplary semiconductor device (e.g., C-FET) 10. The semiconductor device 10 includes a lower device 10L (e.g., a p-type transistor) and an upper device 10U (e.g., an n-type transistor) over the lower device 10L. The lower device 10L includes channel layer 26L wrapped around by a lower gate structure 76L. The lower gate structure 76L includes a gate dielectric layer 78 and a conductive structure 80L. The lower device 10L also includes source/drain features (e.g., p-type epitaxial source/drain features) 62L coupled to the channel layers 26L and adjacent the lower gate structure 76L. The upper device 10U includes channel layer 26U wrapped around by an upper gate structure 76U. The upper gate structure 76U includes the gate dielectric layer 78 and a conductive structure 80U. The upper device 10U also includes source/drain features (e.g., n-type epitaxial source/drain features) 62U coupled to the channel layers 26U and adjacent the upper gate structure 76U. An isolation layer 90 is disposed between the upper device 10U and the lower device 10L to electrically insulate the upper gate structure of the upper device 10U from the bottom gate structure of the lower device 10L. The configurations of the elements in the semiconductor device 10 described above are given for illustrative purposes and can be modified depending on the actual implementations. It is understood that some features are omitted in this figure for reason of simplicity.

In some fabrication processes for forming C-FET devices, a superlattice structure including a number of channel layers interleaved by a number of sacrificial layers is first formed, in which the sacrificial layers reserve space between adjacent channel layers. Then, the sacrificial layers are selectively removed to release the channel layers (e.g., channel layers 26L and 26U), and metal gate structures (e.g., gate structures 76L and 76U) are formed in the space reserved by the sacrificial layers. The channel layers and the sacrificial layers have different semiconductor compositions, which allows selective removal of the sacrificial layers. In some implementations, the channel layers are formed of silicon (Si) and the sacrificial layers are formed of silicon germanium (SiGe). The germanium (Ge) atoms may diffuse to the interface between the channel layers and the sacrificial layers and intermix with Si atoms, particularly during thermal treatments of a fabrication flow. The diffusion of Ge atoms may cause uneven concentration of Ge in the SiGe layers. For example, a middle portion of a SiGe layer may have a higher concentration of Ge than top and bottom portions due to the losing of Ge atoms in the top and bottom portions. When such a SiGe layer with uneven Ge distribution is etched, the etched amount in the middle portion of the SiGe layer may be greater than the etched amount in the top and bottom portions of the SiGe layer, resulting in poor etching profile. Further, Ge atoms diffused into the channel layers may deteriorate device performance. There is a need to suppress or block the diffusion of Ge atoms in the superlattice.

The present disclosure provides a method of forming diffusion barrier layers at the interface between the channel layers and the sacrificial layers of a superlattice. Since the diffusion barrier layers prevent intermixing at interface between the channel layers and the sacrificial layers, the diffusion barrier layers are also referred to as intermixing barrier layers or short for barrier layers. In some embodiments, the barrier layers are formed of a two-dimensional (2D) material. The term "2D material" used in this disclosure refers to single layer material or monolayer-type material that is atomically thin crystalline solid having intralayer covalent bonding and interlayer van der Waals bonding. Examples of a 2D material may include graphene, hexagonal boron nitride (h-BN), calcium fluoride ($CaF_2$), GaS, GaSe, or transition metal dichalcogenides ($MX_2$), where M is a transition metal element and X is a chalcogenide element. Some exemplary $MX_2$ materials may include, but are not limited to $MoS_2$, $MoSe_2$. $ReSe_2$, $ReS_2$, $WSe_2$, $WS_2$, or any combination thereof. Implementing the barrier layers as 2D material layers provide benefits for at least two folds. First, the 2D material layers may effectively block the diffusion of Ge atoms from the sacrificial layers into the channel layers. In addition, the 2D material layers are sufficiently thin, such that crystalline structures of the channel layers and sacrificial layers may still epitaxially grow through the 2D material layers. Allowing the semiconductor layers remotely grow from adjacent semiconductor layers safeguards the crystalline structure purity of the superlattice.

The various aspects of the present disclosure will now be described in more detail with reference to the FIGS. 2-12B. In that regard, FIG. 2 illustrates a flow chart of a method 100 for forming a semiconductor device 200 including a vertical C-FET, according to one or more aspects of the present disclosure. Method 100 is described below in conjunction with FIGS. 3-12B, which are fragmentary cross-sectional views of the workpiece 200 at different stages of fabrication according to embodiments of method 100. Method 100 is merely an example and is not intended to limit the present disclosure to what is explicitly illustrated therein. Additional steps may be provided before, during and after method 100, and some steps described can be replaced, eliminated, or moved around for additional embodiments of the method. Not all steps are described herein in detail for reasons of simplicity. Because the workpiece 200 will be fabricated into a semiconductor device 200 upon conclusion of the fabrication processes, the workpiece 200 may be referred to as the semiconductor device 200 as the context requires.

Figure 3:
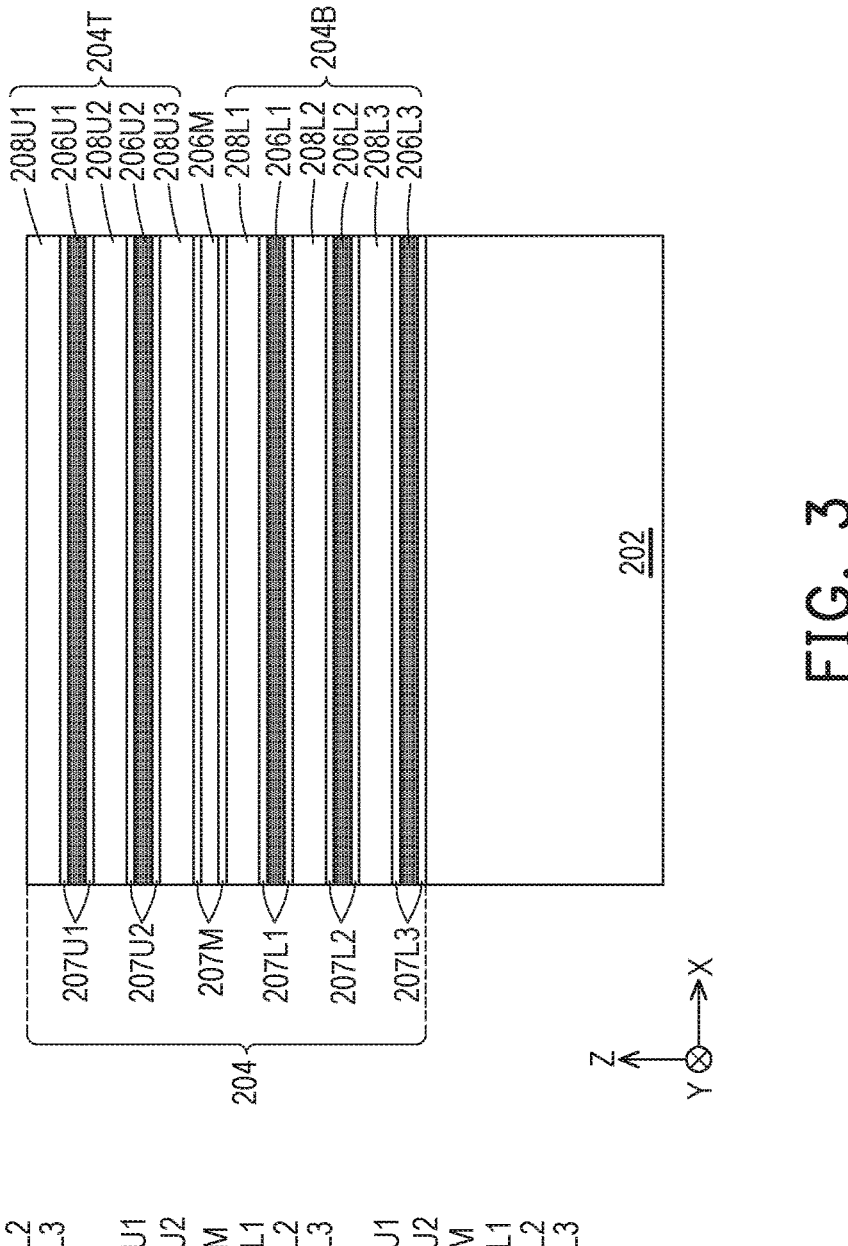
FIGS. 3, 4, 5, 6, 7, 8, 9A, and 9B illustrate fragmentary cross-sectional views of a workpiece during various fabrication stages in the method of FIG. 2, according to various aspects of the present disclosure.

Referring now to FIGS. 2 and 3, method 100 includes a block 102 where a workpiece 200 is received. The workpiece 200 includes a substrate 202. In one embodiment, the substrate 202 may be a silicon (Si) substrate. In some other embodiments, the substrate 202 may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 202 may also include an insulating layer, such as a silicon oxide layer, to have a silicon-on-insulator (SOI) structure. Although not explicitly shown in the figures, the substrate 202 may include an n-type well region and a p-type well region for fabrication of transistors of different conductivity types. When present, each of the n-type well and the p-type well is formed in the substrate 202 and includes a doping profile. An n-type well may include a doping profile of an n-type dopant, such as phosphorus (P) or arsenic (As). A p-type well may include a doping profile of a p-type dopant, such as boron (B). The doping in the n-type well and the p-type well may be formed using ion implantation or thermal diffusion and may be considered portions of the substrate 202. For ease of reference, the substrate 202 and structures formed thereon during the method 100 may be referred to as a workpiece 200.

The workpiece 200 also includes a superlattice structure 204 formed over the substrate 202. The superlattice structure 204 includes a number of channel layers 208 interleaved by a number of sacrificial layers 206. The sacrificial layers 206 and the channel layers 208 are deposited alternatingly, one-after-another, to form the superlattice structure 204. The superlattice structure 204 further includes a number of barrier layers 207 interposing adjacent channel layers 208 and sacrificial layers 206. The channel layers 208 and the sacrificial layers 206 may have different semiconductor compositions. In some implementations, the channel layers 208 are formed of silicon (Si) and sacrificial layers 206 are formed of silicon germanium (SiGe). In some implementations, the concentration of Ge atoms (atomic percentage) in the sacrificial layers 206 ranges from about 30% to about 60%. The additional germanium content in the sacrificial layers 206 allow selective removal or recess of the sacrificial layers 206 without inducing substantial damages to the channel layers 208. The barrier layers 207 may be formed of a 2D material and also referred to as 2D material layers 207. In some embodiments, the barrier layers 207 may include graphene, hexagonal boron nitride (h-BN), calcium fluoride ($CaF_2$), GaS, GaSe, or transition metal dichalcogenides ($MX_2$), where M is a transition metal element and X is a chalcogenide element. Some exemplary $MX_2$ materials may include, but are not limited to $MoS_2$, $MoSe_2$, $ReSe_2$, $ReS_2$. $WSe_2$, $WS_2$, or any combination thereof. In some embodiments, the barrier layers 207 are free of dopant. In some alternative embodiments, the barrier layers 207 may be doped with a dopant, such as sulfur (S), selenium (Se), tellurium (Te), zirconium (Zr), hafnium (Hf), tungsten (W), molybdenum (Mo), boron (B), oxygen (O), nitrogen (N), carbon (C), silicon (Si), or tin (Sn).

In some embodiments, the sacrificial layers 206 and channel layers 208 are epitaxy layers and may be deposited over the substrate 202 using an epitaxy process. Suitable epitaxy processes include vapor-phase epitaxy (VPE), molecular beam epitaxy (MBE), liquid phase epitaxy (LPE), selective epitaxial growth (SEG), and/or other suitable processes. As a comparison, the barrier layers 207 may be deposited by a deposition process different from the epitaxial process for forming the sacrificial layers 206 and channel layers 208. Suitable deposition processes include physical vapor deposition (PVD), chemical vapor deposition (CVD) (e.g., plasma enhanced CVD (PECVD), microwave plasma-assisted CVD (MWCVD), hybrid physical CVD (HPCVD), and thermal CVD), atomic layer deposition (ALD) (e.g., plasma enhanced ALD (PEALD) and thermal ALD), and/or other suitable processes performed under a suitable temperature, for example, in a range from about 100° C. to about 1400° C. The barrier layers 207 may be a single crystal layer with a lattice in cubic, hexagonal, tetragonal, orthorhombic, or other suitable lattice shapes. Using a 2D material as a barrier layer allows a semiconductor layer (either a channel layer 208 or a sacrificial layer 206) formed thereon still remotely epitaxially grow from the adjacent semiconductor layer thereunder. Therefore, the crystalline structure would not be interrupted.

For ease of references, the superlattice structure 204 may be vertically divided into a bottom portion 204B, a middle sacrificial layer 206M on the bottom portion 204B, and a top portion 204T on the middle sacrificial layer 206M. In this depicted example, the bottom portion 204B of the superlattice structure 204 includes channel layers 208L1, 208L2 and 208L3 interleaved by sacrificial layers 206L1, 206L2, and 206L3. The bottom portion 204B further includes a pair of barrier layers 207L3 sandwiching the sacrificial layer 206L3, a pair of barrier layers 207L2 sandwiching the sacrificial layer 206L2, and a pair of barrier layers 207L1 sandwiching the sacrificial layer 206L1. The top portion 204T of the superlattice structure 204 includes channel layers 208U1, 208U2 and 208U3 interleaved by sacrificial layers 206U1 and 206U2. The top portion 204T further includes a pair of barrier layers 207U2 sandwiching the sacrificial layer 206U2 and a pair of barrier layers 207U1 sandwiching the sacrificial layer 206U1. The superlattice structure 204 further includes a pair of barrier layers 207M sandwiching the middle sacrificial layer 206M. Each pair of the barrier layers 207 includes an upper barrier layer directly interfacing a top surface of the respective sacrificial layer 206 and a lower barrier layer directly interfacing a bottom surface of the respective sacrificial layer 206, which separate the respective sacrificial layer 206 from physically contacting adjacent channel layers 208 and also block Ge atoms from diffusing into the adjacent channel layers 208.

The channel layers 208L1, 208L2, 208L3, 208U1, 208U2, and 208U3 will provide nanostructures for the C-FET 10. In some embodiments, the channel layers 208U1-208U2, and the channel layers 208L2-208L3 will provide channel members for a top MBC transistor and a bottom MBC transistor in the C-FET 10, respectively. The term "channel member(s)" is used herein to designate any material portion for channel(s) in a transistor with nanoscale dimensions, and having an elongate shape, regardless of the cross-sectional shape of this portion. A germanium content of the middle sacrificial layer 206M may be different from the germanium content of other sacrificial layers (e.g., sacrificial layers 206U1-206U2, sacrificial layers 206L1-206L3) of the top portion 204T and bottom portion 204B. In some embodiments, a germanium content of the middle sacrificial layer 206M may be greater than a germanium content of the other sacrificial layers 206U1-206U2 and 206L1-206L3 such that the entirety of the middle sacrificial layer 206M may be selectively removed during the formation of inner spacer recesses.

It is noted that the superlattice structure 204 in FIG. 3 includes six (6) layers of the channel layers 208 interleaved by six (6) layers of sacrificial layers 206, which is for illustrative purposes only and not intended to be limiting beyond what is specifically recited in the claims. It can be appreciated that any number of the channel layers 208 can be included in the superlattice structure 204 and distributed between the bottom portion 204B and the top portion 204T. The number of layers depends on the desired number of channels members for the top MBC transistor and the bottom MBC transistor. In some embodiments, the number of the channel layers 208 in the superlattice structure 204 may be between 4 and 10. The thicknesses of the channel layers 208 and the sacrificial layers 206 may be selected based on device performance considerations of the bottom MBC transistor, the top MBC transistor, and the C-FET as a whole. In some embodiments, the channel layers 208 are substantially uniform in thickness, such as a thickness ranging from about 3 nm to about 6 nm. In some embodiments, the sacrificial layers 206 are substantially uniform in thickness, such as a thickness ranging from about 3 nm to about 6 nm. Yet in some alternative embodiments, the middle sacrificial layer 206M is thicker (e.g., double or triple the thickness) than other sacrificial layers 206. The barrier layers 207 are thinner than the channel layers 208 and sacrificial layers 206. In some embodiments, the barrier layers 207 are substantially uniform in thickness, such as a monolayer of a 2D material or a few monolayers of a 2D material. In one example, a thickness of the barrier layers 207 ranges from about 0.3 nm to about 2 nm. Yet in some alternative embodiments, in which the middle sacrificial layer 206M may have a higher Ge concentration than other sacrificial layers 206, the respective pair of the barrier layers 207M may be thicker than other barrier layers 207 to more effectively block the diffusion of Ge atoms from the middle sacrificial layer 206M. For example, the barrier layers 207L1-L3 and 207U1-U2 may be a monolayer, and the barrier layer 207M may be a stack of two or three monolayers.

Figure 4:
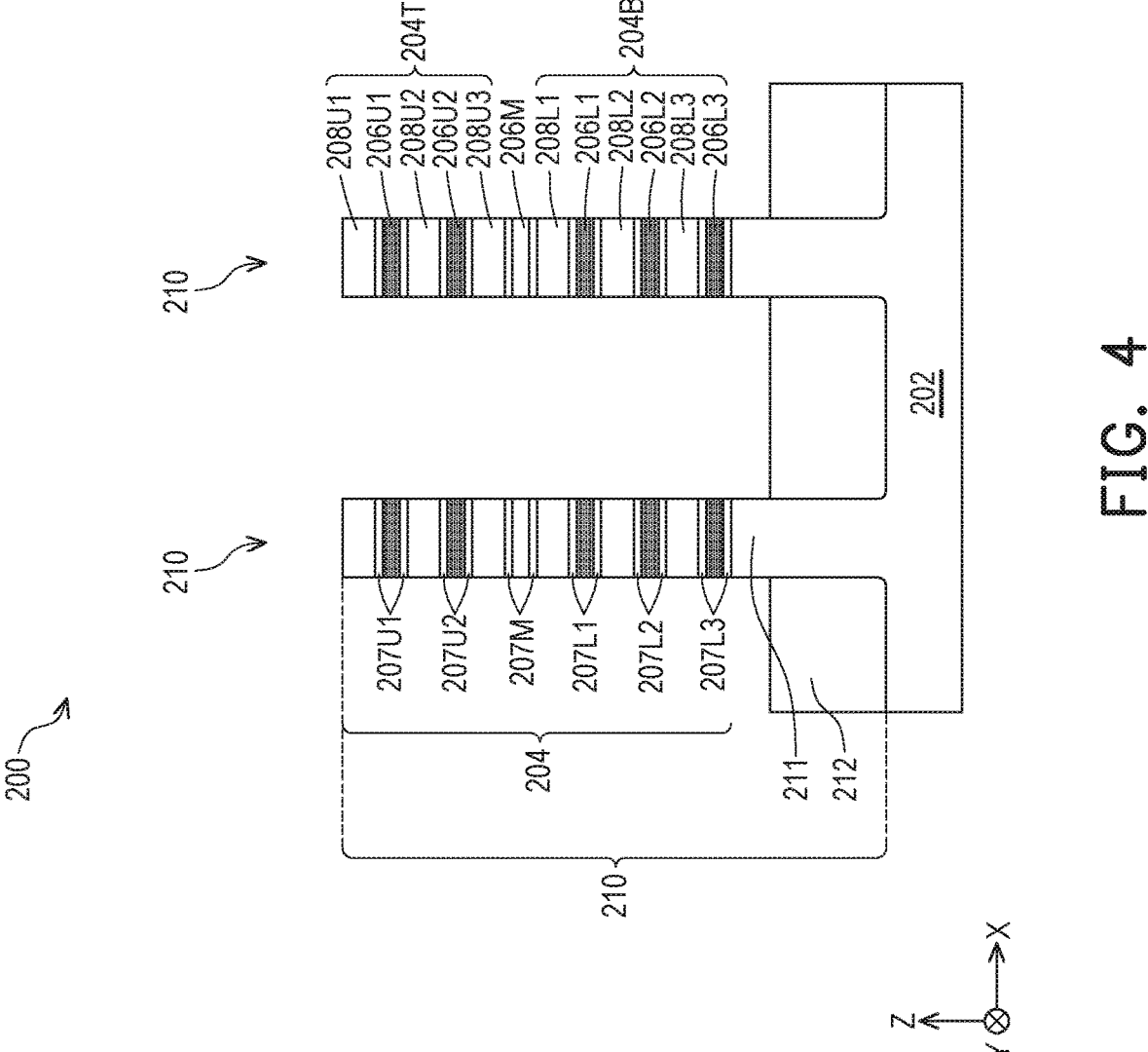

Referring to FIGS. 2 and 4, method 100 includes a block 104 where after forming the superlattice structure 204, the superlattice structure 204 and a top portion of the substrate 202 are then patterned to form the fin-shaped structures 210. For patterning purposes, a hard mask layer may be deposited over the superlattice structure 204. The hard mask layer may be a single layer or a multilayer. In one example, the hard mask layer includes a silicon oxide layer and a silicon nitride layer over the silicon oxide layer. The fin-shaped structures 210 may be patterned using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used as an etch mask to etch the superlattice structure 204 and the substrate 202 to form the fin-shaped structures 210. As shown in FIG. 4, each fin-shaped structure 210 extends vertically along the Z direction from the substrate 202 and extends lengthwise along the Y direction. The patterned top portion of the substrate 202 forms a fin base 211 of the fin-shaped structure 210. The top surface of the fin base 211 is covered by the bottommost barrier layer 207L3.

The method at block 104 also includes forming an isolation feature 212 around the fin-shaped structures 210 to separate two adjacent fin-shaped structures 210. The isolation feature 212 may also be referred to as a shallow trench isolation (STI) feature 212. In an example process, a dielectric material for the isolation feature 212 is deposited over the workpiece 200, including the fin-shaped structure 210, using CVD, subatmospheric CVD (SACVD), flowable CVD, spin-on coating, and/or other suitable process. Then the deposited dielectric material is planarized and recessed to form the isolation feature 212. The dielectric material for the isolation feature 212 may include silicon oxide, silicon oxynitride, fluorine-doped silicate glass (FSG), a low-k dielectric, combinations thereof, and/or other suitable materials. As shown in FIG. 4, the fin base 211 rises above the isolation feature 212.

Figure 5:
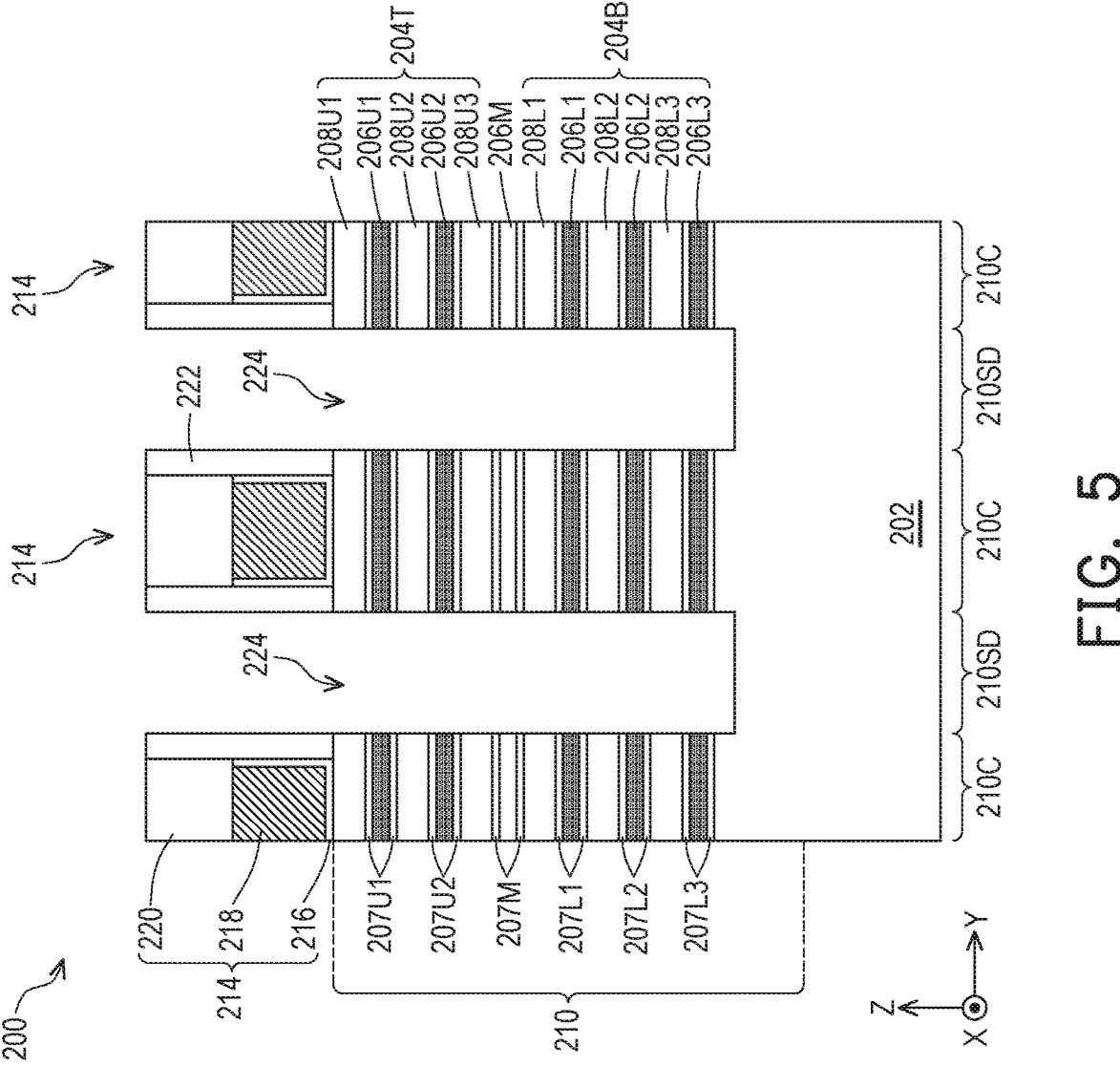

Referring to FIGS. 2 and 5, method 100 includes a block 106 where dummy gate stacks 214 are formed over channel regions 210C of the fin-shaped structure 210. In some embodiments, a gate replacement process (or gate-last process) is adopted where the dummy gate stack 214 serves as a placeholder for a functional gate structure. Other processes and configurations are possible. To form the dummy gate stack 214, a dummy dielectric layer 216, a dummy gate electrode layer 218, and a gate-top hard mask layer 220 are deposited over the workpiece 200. The deposition of these layers may include use of low-pressure CVD (LPCVD), CVD, plasma-enhanced CVD (PECVD), physical vapor deposition (PVD), atomic layer deposition (ALD), thermal oxidation, e-beam evaporation, other suitable deposition techniques, and/or combinations thereof. The dummy dielectric layer 216 may include silicon oxide, the dummy gate electrode layer 218 may include polysilicon, and the gate-top hard mask layer 220 may be a multi-layer that includes silicon oxide and silicon nitride. Using photolithography and etching processes, the gate-top hard mask layer 220 is patterned. The photolithography process may include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. The etching process may include dry etching, wet etching, and/or other etching methods. Like the fin-shaped structures 210, the dummy gate stack 214 may also be patterned using double-patterning or multiple-patterning techniques. Thereafter, using the patterned gate-top hard mask 220 as an etch mask, the dummy dielectric layer 216 and the dummy gate electrode layer 218 are then etched to form the dummy gate stack 214. The dummy gate stack 214 extends lengthwise along the X direction to wrap over the fin-shaped structure 210 and lands on the isolation feature 212. The portion of the fin-shaped structure 210 underlying the dummy gate stack 214 defines a channel region 210C. The channel region 210C and the dummy gate stack 214 also define source/drain regions 210SD that are not vertically overlapped by the dummy gate stack 214. The channel region 210C is disposed between two source/drain regions 210SD along the Y direction. Source/drain region(s) may refer to a source region for forming a source or a drain region for forming a drain, individually or collectively dependent upon the context.

Still referring to FIGS. 2 and 5, method 100 includes a block 108 where source/drain regions 210SD of the fin-shaped structure 210 are recessed to form source/drain recesses 224. Operations at block 106 may include formation of at least one gate spacer 222 over the sidewalls of the dummy gate stack 214 before the source/drain regions 210SD are recessed. In some embodiments, the formation of the at least one gate spacer 222 includes deposition of one or more dielectric layers over the workpiece 200. In an example process, the one or more dielectric layers are conformally deposited using CVD, SACVD, or ALD. The one or more dielectric layers may include silicon oxide, silicon nitride, silicon carbide, silicon oxynitride, silicon carbonitride, silicon oxycarbide, silicon oxycarbonitride, and/or combinations thereof. After the deposition of the at least one gate spacer 222, an anisotropic etch process is performed to the workpiece 200 to form the source/drain recesses 224. The etch process at block 106 may be a dry etch process or other suitable etch process. An example dry etch process may implement an oxygen-containing gas, hydrogen, a fluorine-containing gas (e.g., $CF_4$, $SF_6$, $NF_3$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. As shown in FIG. 5, sidewalls of the sacrificial layers 206, the channel layers 208, and the barrier layers 207 in the channel regions 210C are exposed in the source/drain recesses 224.

Figure 6:
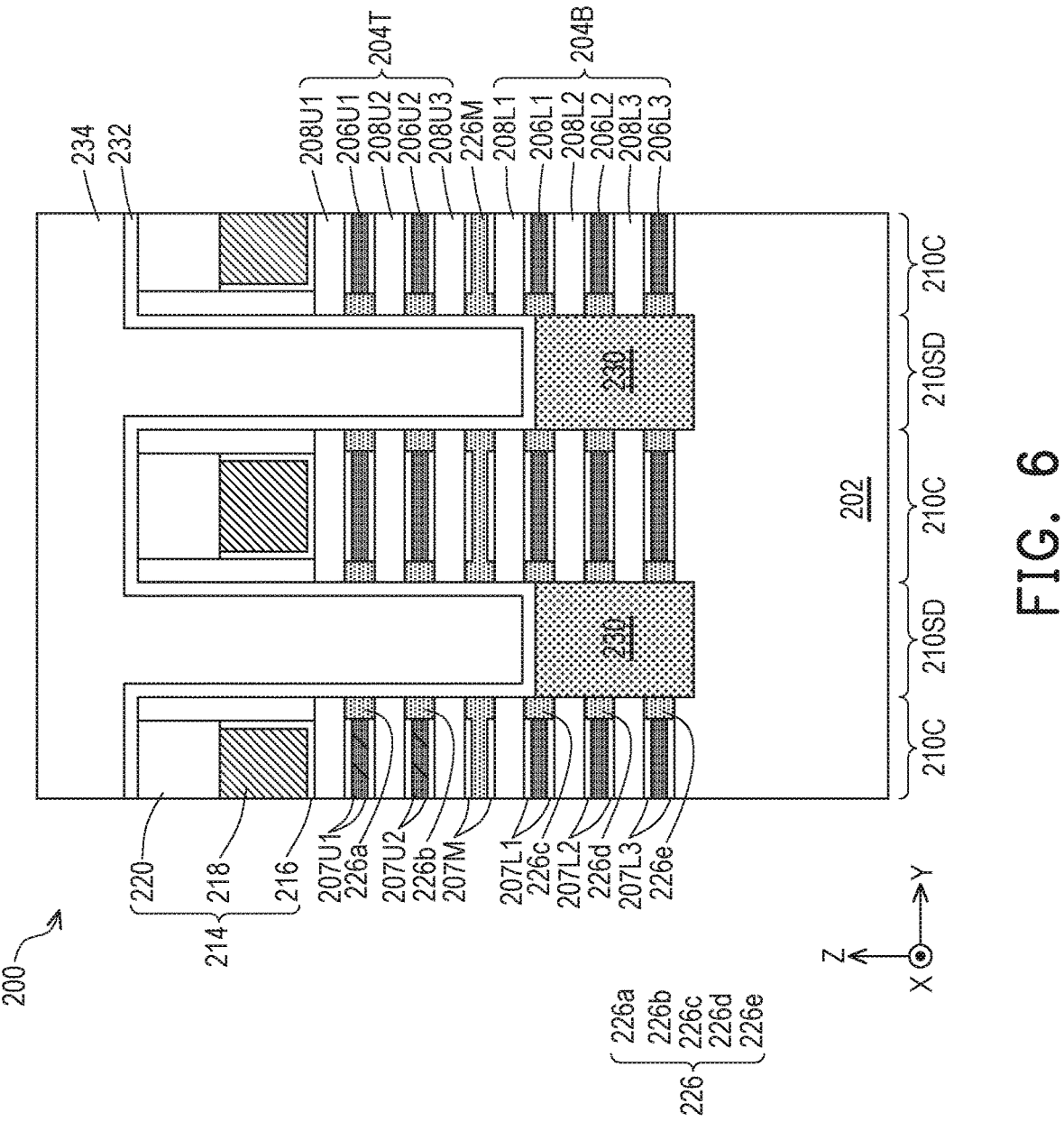

Referring to FIGS. 2 and 6, method 100 includes a block 110 where inner spacer features 226 are formed. At block 110, the sacrificial layers 206 exposed in the source/drain recesses 224 are selectively and partially recessed to form inner spacer recesses, while the exposed channel layers 208 are substantially unetched. The laterally recessing of the sacrificial layer 206 may also laterally recess the barrier layers 207. The middle sacrificial layer 206M, due to its greater germanium content, may be substantially removed during the formation of inner spacer recesses. In some embodiments, the selective recess may be a selective isotropic etching process (e.g., a selective dry etching process or a selective wet etching process), and the extent at which the sacrificial layers 206 are recessed is controlled by duration of the etching process. The selective dry etching process may include use of one or more fluorine-based etchants, such as fluorine gas or hydrofluorocarbons. The selective wet etching process may include use of hydrogen fluoride (HF) or ammonium hydroxide ($NH_4OH$).

After the formation of the inner spacer recesses, an inner spacer material layer is deposited over the workpiece 200, including in the inner spacer recesses. Additionally, as shown in FIG. 6, the inner spacer material layer may also be deposited in the space left behind by selective removal of the middle sacrificial layer 206M. The inner spacer material layer may include silicon oxide, silicon nitride, silicon oxycarbide, silicon oxycarbonitride, silicon carbonitride, metal nitride, or a suitable dielectric material. The deposited inner spacer material layer is then etched back to remove excess portions of the inner spacer material layer over the dummy gate stack 214, the gate spacer 222, and sidewalls of the channel layers 208, thereby forming the inner spacer features 226 and the middle dielectric layer 226M as shown in FIG. 6. Due to the barrier layers 207M disposed on middle portions of the top and bottom surfaces of the middle dielectric layer 226M, the middle dielectric layer 226M has a dumbbell shape. In the present embodiments, the inner spacer features 226 includes inner spacer features 226a and 226b disposed over the middle dielectric layer 226M and inner spacer features 226c, 226d, and 226c disposed under the middle dielectric layer 226M. Each of the inner spacer features 226a-226e and the middle dielectric layer 226M is disposed between two vertically adjacent channel layers 208. For example, the inner spacer feature 226b is disposed between the channel layer 208U2 and the channel layer 208U3, and the inner spacer feature 226c is disposed between the channel layer 208L1 and the channel layer 208L2. In some embodiments, the etch back process at block 110 may be a dry etch process that includes use of an oxygen-containing gas, hydrogen, nitrogen, a fluorine-containing gas (e.g., $NF_3$, $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas (e.g., $CF_3I$), other suitable gases and/or plasmas, and/or combinations thereof.

Still referring to FIGS. 2 and 6, method 100 includes a block 112 where bottom source/drain features 230 are formed in the source/drain recesses 224. In some embodiments, before the deposition of the bottom source/drain features 230, a blocking layer (not shown) may be deposited over the workpiece 200 to cover sidewalls of the top portion 204T of the superlattice structure 204. The blocking layer may also cover sidewalls of the middle dielectric layer 226M and the channel layer 208L1. The blocking layer may include dielectric materials. After the formation of the blocking layer, the bottom source/drain features 230 may be formed using an epitaxial process, such as VPE, MBE, LPE, SEG, and/or other suitable processes. The epitaxial growth process may use gaseous and/or liquid precursors, which interact with the composition of the substrate 202 as well as the channel layers 208 not covered by the blocking layer. In the present embodiments, the epitaxial growth of bottom source/drain features 230 may take place from both the top surface of the substrate 202 and the exposed sidewalls of the bottom channel layers 208L2 and 208L3. The blocking layer, due to its dielectric composition, blocks formation of the bottom source/drain features 230 on sidewalls of the channel layers 208U1-208U3 and 208L1. As illustrated in FIG. 6, the bottom source/drain features 230 are in physical contact with (or adjoining) the channel layers 208L2 and 208L3. Depending on the design, the bottom source/drain features 230 may be n-type or p-type. In the depicted embodiments, the bottom source/drain features 230 are p-type source/drain features and may include germanium, gallium-doped silicon germanium, boron-doped silicon germanium, or other suitable material and may be in-situ doped during the epitaxial process by introducing a p-type dopant, such as boron or gallium, or ex-situ doped using a junction implant process.

Still referring to FIGS. 2 and 6, method 100 includes a block 114 where a bottom contact etch stop layer (CESL) 232 and a bottom interlayer dielectric (ILD) layer 234 are deposited over the bottom source/drain features 230. The bottom CESL 232 may include silicon nitride, silicon oxynitride, and/or other materials and may be formed by CVD, ALD, plasma-enhanced chemical vapor deposition (PECVD) process and/or other suitable deposition or oxidation processes. In an embodiment, the bottom CESL 232 includes silicon nitride, and a ratio of nitrogen concentration to silicon concentration (i.e., N/Si) of the bottom CESL 232 is in a range between about 1.1 and about 1.3. In some embodiments, the bottom CESL 232 is first conformally deposited on the workpiece 200 and the bottom ILD layer 234 is deposited over the bottom CESL 232 by spin-on coating, flowable CVD (FCVD), CVD, or other suitable deposition technique. The bottom ILD layer 234 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials.

Figure 7:
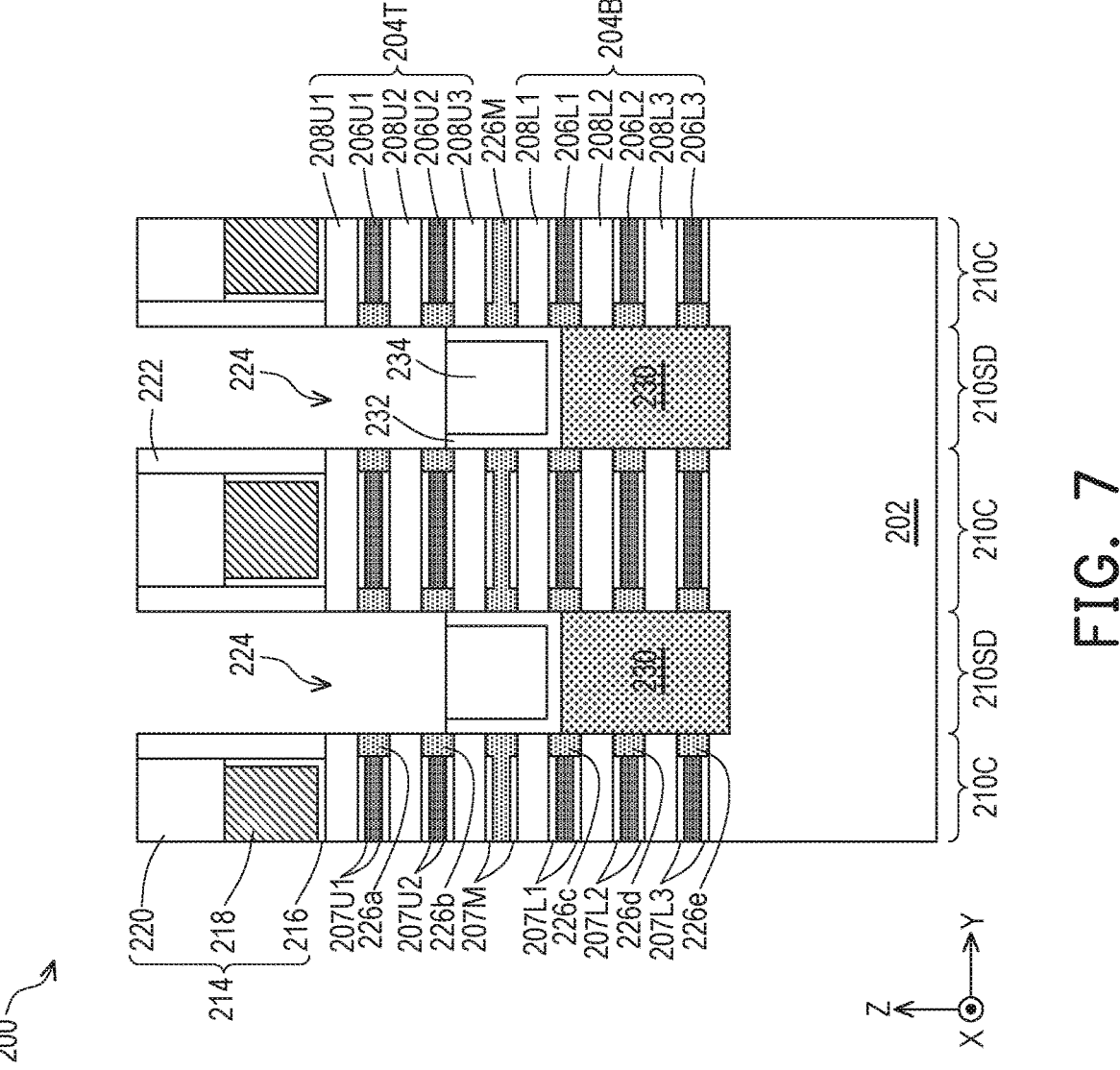

Referring to FIGS. 2 and 7, method 100 includes a block 116 where the bottom CESL 232 and the bottom ILD layer 234 are etched back. As shown in FIG. 6, the bottom CESL 232 and the bottom ILD layer 234 are etched back to exposed sidewalls of the channel layers 208U1 and 208U2. In embodiments presented by FIG. 6, after being etched back, the bottom CESL 232 is in direct contact with the inner spacer features 226b-226c, the channel layers 208U3, 208L1, and the middle dielectric layer 226M. The blocking layer may be removed during the etch back of the bottom CESL 232 and the bottom ILD layer 234.

Figure 8:
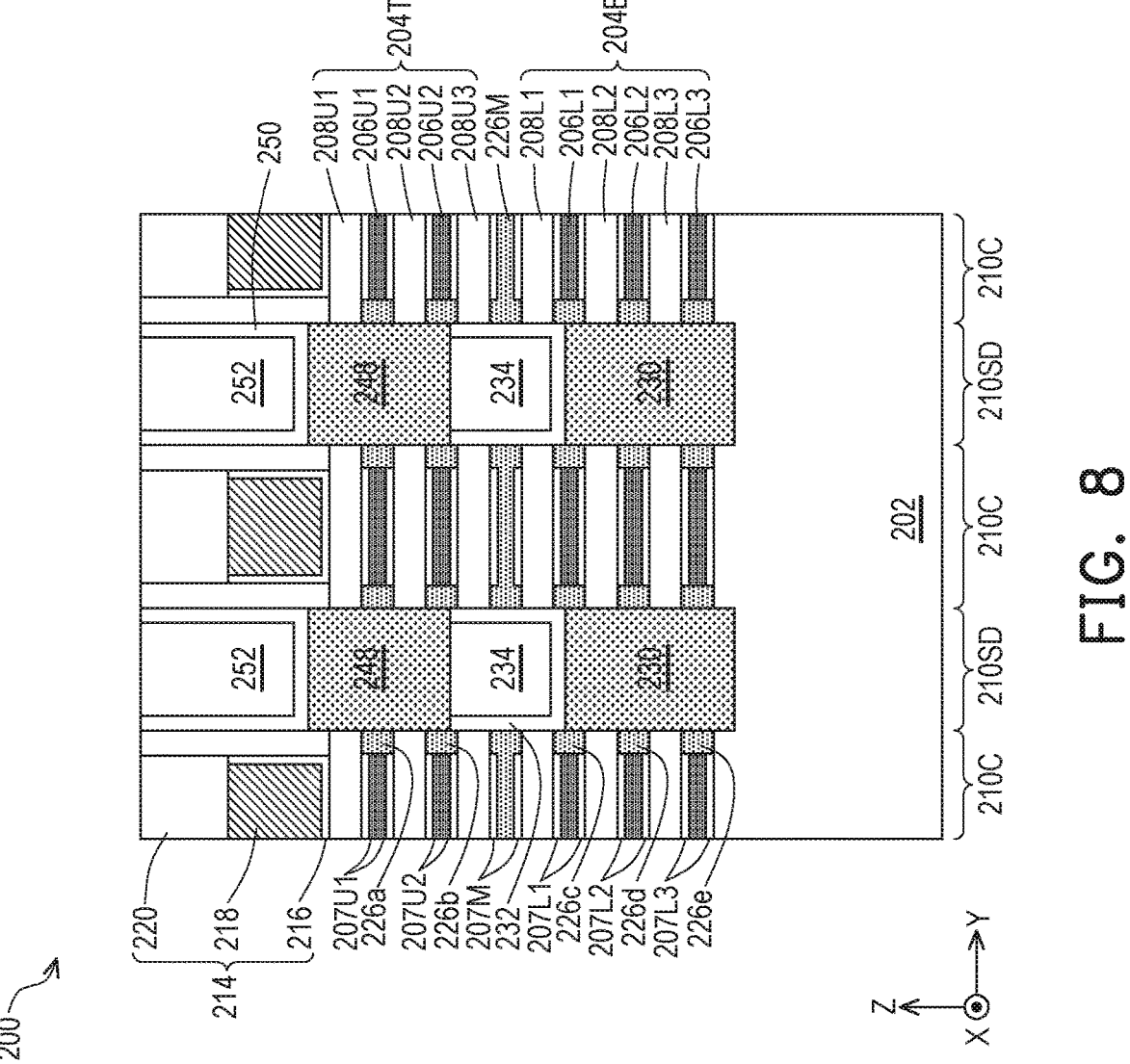

Referring to FIGS. 2 and 8, method 100 includes a block 118 where top source/drain features 248 are formed over the bottom CESL 232 and ILD layer 234. The top source/drain features 248 may be formed using an epitaxial process, such as VPE, MBE, LPE, SEG, and/or other suitable processes. The epitaxial growth process may use gaseous and/or liquid precursors, which interact with composition of the channel layers (e.g., channel layers 208U1 and 208U2) of the top portion 204T of the superlattice structure 204. The epitaxial growth of top source/drain features 248 may take place from the exposed sidewalls of the top channel layers 208U1 and 208U2. The deposited top source/drain features 248 are in physical contact with (or adjoining) the channel layers of the top portion 204T of the superlattice structure 204. Depending on the design, the top source/drain features 248 may be n-type or p-type. In the depicted embodiments, the top source/drain features 248 are n-type source/drain features and may include silicon, phosphorus-doped silicon, arsenic-doped silicon, antimony-doped silicon, or other suitable material and may be in-situ doped during the epitaxial process by introducing an n-type dopant, such as phosphorus, arsenic, or antimony, or ex-situ doped using a junction implant process.

Still referring to FIGS. 2 and 8, method 100 includes a block 120 where a top CESL 250 and a top ILD layer 252 are deposited over the top source/drain features 248. The top CESL 250 may include silicon nitride, silicon oxynitride, and/or other materials known in the art and may be formed by CVD, ALD, plasma-enhanced chemical vapor deposition (PECVD) process and/or other suitable deposition or oxidation processes. In some embodiments, the top CESL 250 is first conformally deposited on the workpiece 200 and the top ILD layer 252 is then deposited over the top CESL 250 by spin-on coating, FCVD, CVD, or other suitable deposition technique. The top ILD layer 252 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In some embodiments, after formation of the top ILD layer 252, the workpiece 200 may be annealed to improve integrity of the top ILD layer 252. To remove excess materials and to expose top surfaces of the dummy gate stacks 214, a planarization process, such a chemical mechanical polishing (CMP) process may be performed.

Figures 9A, 9B:
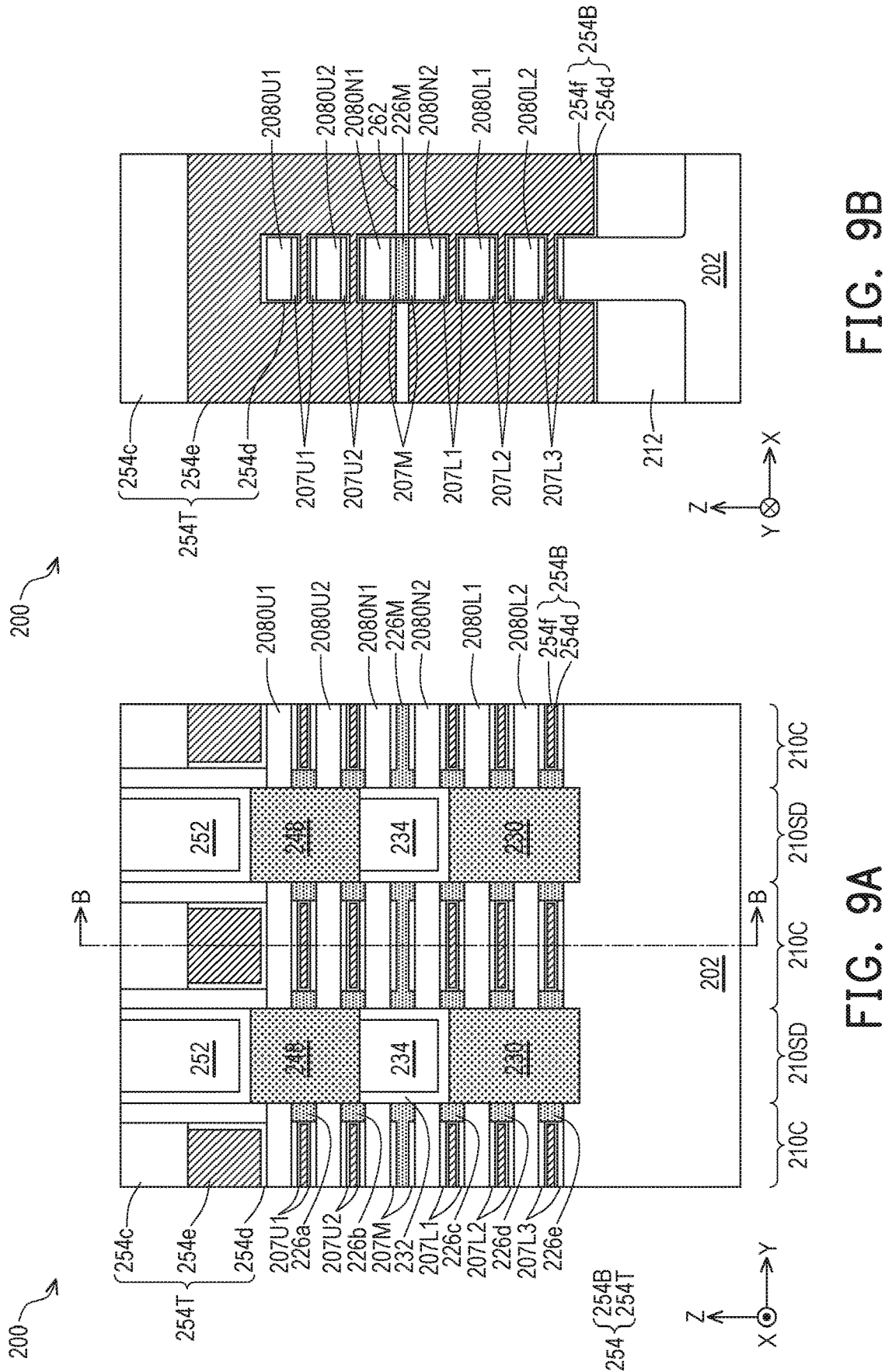
Figures 10A, 10B:
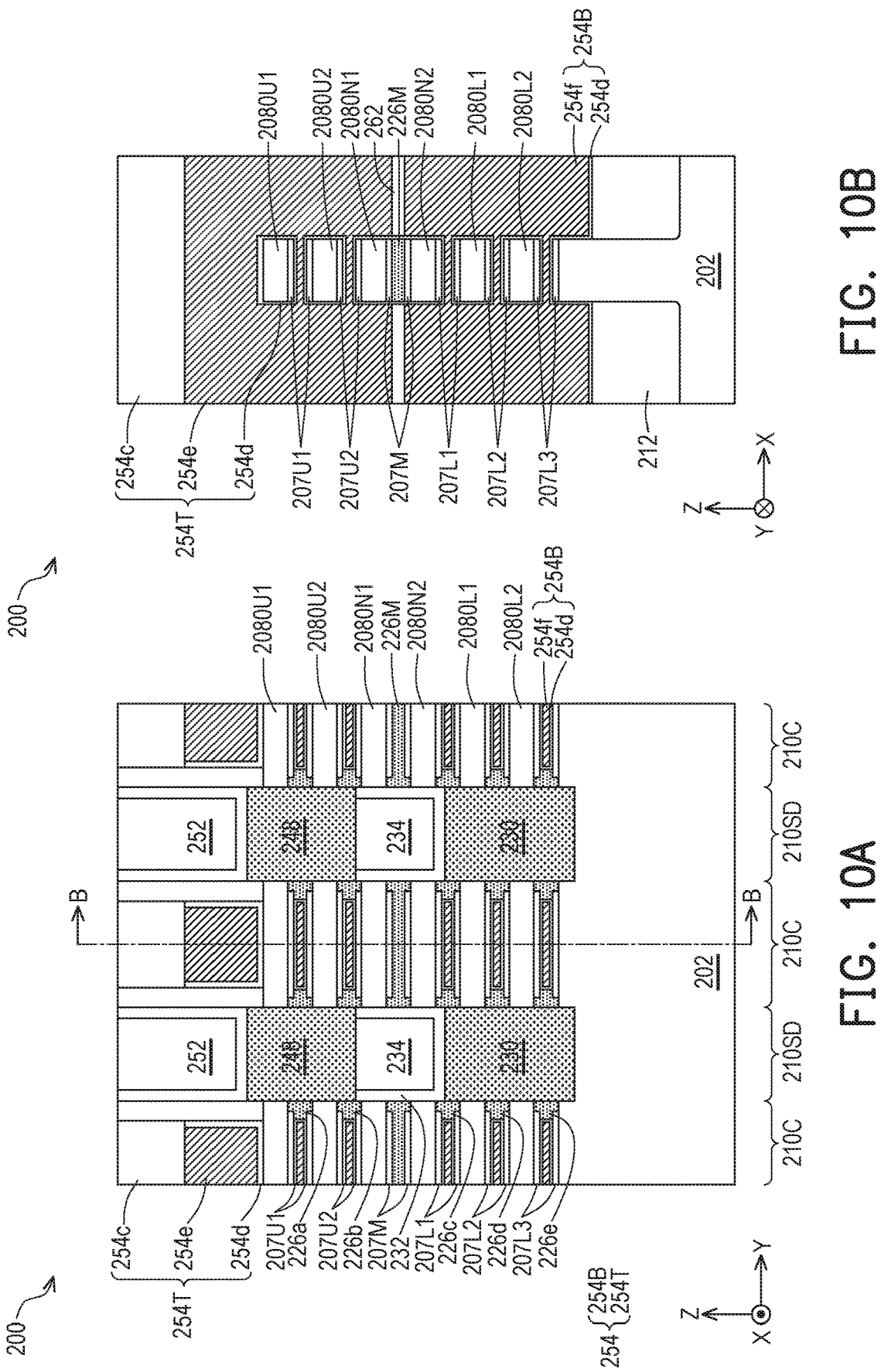
FIGS. 10A, 10B, 11A, 11B, 12A, and 12B illustrate fragmentary cross-sectional views of alternative semiconductor devices, according to one or more aspects of the present disclosure.

Referring to FIGS. 2 and 9A-9B, method 100 includes a block 122 where the dummy gate stack 214 is replaced with a gate structure 254. FIG. 9A depicts a cross-sectional view of the workpiece 200 in the Y-Z plane, and FIG. 9B depicts a cross-sectional view of the workpiece 200 taken along line B-B shown in FIG. 9A. Operations at block 130 may include removal of the dummy gate stacks 214, release of the channel layers 208 as nanostructures as being functional channel members (including top channel members 2080U1, 2080U2, and bottom channel members 2080L1, and 2080L2) and nanostructures as being non-functional channel members (including the nanostructures 2080N1 and 2080N2) and formation of gate structures 254 to wrap around the nanostructures 2080. The removal of the dummy gate stacks 214 may include one or more etching processes that are selective to the material in the dummy gate stacks 214. For example, the removal of the dummy gate stacks 214 may be performed using as a selective wet etch, a selective dry etch, or a combination thereof. After the removal of the dummy gate stacks 214, sidewalls of the channel layers 208, sacrificial layers 206, and barrier layers 207 in the channel regions 210C are exposed. Thereafter, the sacrificial layers 206 in the channel regions 210C are selectively removed to release the channel layers 208 as the functional channel members (including the top channel members 2080U1, 2080U2, the bottom channel members 2080L1, 2080L2) and non-functional channel members (including the nanostructures 2080N1 and 2080N2). The selective removal of the sacrificial layers 206 may be implemented by a selective dry etch, a selective wet etch, or other selective etch processes. In some embodiments, the selective wet etching includes an APM etch (e.g., ammonia hydroxide-hydrogen peroxide-water mixture). In some other embodiments, the selective removal includes SiGe oxidation followed by a silicon germanium oxide removal. For example, the oxidation may be provided by ozone clean and then silicon germanium oxide removed by an etchant such as $NH_4OH$.

After the selective removal of the sacrificial layers 206, the gate structure 254 is deposited to wrap around each of the top channel members 2080U1 and 2080U2 and bottom channel members 2080L1 and 2080L2, thereby forming a bottom multi-gate transistor (e.g., 10L in FIG. 1) and a top multi-gate transistor (e.g., 10U in FIG. 1) disposed over the bottom multi-gate transistor. In the depicted embodiments, both the bottom multi-gate transistor and the top multi-gate transistor are MBC transistors. In some embodiments, the gate structure 254 may be a common gate structure to engage the bottom channel members and the top channel members. In some other embodiments depicted in the drawings, the gate structure 254 includes a bottom gate portion 254B to engage bottom channel members 2080L1 and 2080L2 and a top gate portion 254T to engage the top channel members 2080U1 and 2080U2. The bottom gate portion 254B and the top gate portion 254T have different work function layers. When the gate structure 254 includes a bottom gate portion 254B and a top gate portion 254T, the two gate portions may be electrically isolated from each other by the middle dielectric layer 226M and an insulation layer 262. For example, the bottom gate portion 254B may include p-type work function layers and the top gate portion 254T may include n-type work function layers. While not explicitly shown in the figures, the gate structure 254 includes an interfacial layer to interface the channel members. The gate structure 254 also includes a gate dielectric layer 254d over the interfacial layer and a gate electrode layer 254c/254f which includes a p-type work function layer or an n-type work function layer, respectively. The gate dielectric layer 254d is deposited over the workpiece 200 using ALD, CVD, and/or other suitable methods. The gate dielectric layer 254d is formed of high-K dielectric materials. As used and described herein, high-k dielectric materials include dielectric materials having a high dielectric constant, for example, greater than that of thermal silicon oxide (~3.9). The gate dielectric layer 254d may include hafnium oxide. Alternatively, the gate dielectric layer 254d may include other high-K dielectrics, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), $(Ba,Sr)TiO_3$ (BST), silicon nitride (SiN), silicon oxynitride (SiON), combinations thereof, or other suitable material.

After the deposition of the gate dielectric layer 254d, the gate electrode layer 254f and the gate electrode layer 254e are formed over the channel regions 210C. In an example process, the first gate electrode layer 254f is first deposited, then the first gate electrode 254f is etched back using a suitable process, such as a dry etch process until a top surface of the first gate electrode 254f is below a top surface of the middle dielectric layer 226M. After the etching back, an insulation layer 262 is deposited over the first gate electrode layer 254f. The gate electrode layer 254f may include a p-type work function layer, and the gate electrode layer 254c may include an n-type work function layer. Each of the p-type work function layer and the n-type work function layer may include a single layer or alternatively a multi-layer structure, such as various combinations of a metal layer with a selected work function to enhance the device performance (work function metal layer). By way of example, the p-type work function layer in the gate electrode layer 254*f* may include titanium nitride (TiN), tantalum nitride (TaN), ruthenium (Ru), molybdenum (Mo), aluminum (Al), tungsten nitride (WN), zirconium silicide (ZrSi$_2$), molybdenum silicide (MoSi$_2$), tantalum silicide (TaSi$_2$), nickel silicide (NiSi$_2$), other p-type work function material, or combinations thereof. The n-type work function layer in the gate electrode layer 254*c* may include titanium (Ti), aluminum (Al), silver (Ag), manganese (Mn), zirconium (Zr), titanium aluminum (TiAl), titanium aluminum carbide (TiAlC), tantalum carbide (TaC), tantalum carbonitride (TaCN), tantalum silicide nitride (TaSiN), tantalum aluminum (TaAl), tantalum aluminum carbide (TaAlC), titanium aluminum nitride (TiAlN), other n-type work function material, or combinations thereof. The gate electrode layer 254*f*/254*e* may also include a metal fill to reduce contact resistance. In some instance, the metal fill includes tungsten (W). The gate structure 254 may also include a liner layer, a wetting layer, an adhesion layer, a metal alloy or a metal silicide. In the depicted embodiment, the top gate portion 254T also includes a dielectric capping layer 254*c* formed over the n-type work function layer 254*c*.

In the depicted embodiment as shown in FIG. 9A, the top channel members 2080U1 and 2080U2 are in direct contact with the top source/drain features 248; the bottom channel members 2080L1 and 2080L2 are in direct contact with the bottom source/drain features 230; and the nanostructures 2080N1, 2080N2 and the middle dielectric layer 226M are in direct contact with the bottom CESL 232. In the depicted embodiments as shown in FIG. 9B, the gate dielectric layer 254*d* wraps the top channel member 2080U1 and the barrier layer 207U1 disposed on the bottom surface of the top channel member 2080U1. Particularly, the gate dielectric layer 254*d* directly interfaces the top and sidewall surfaces of the top channel member 2080U1. The gate dielectric layer 254*d* wraps the top channel member 2080U2 and the barrier layers 207U1 and 207U2 that sandwich the top channel member 2080U2. The gate dielectric layer 254*d* only directly interfaces the sidewall surfaces of the top channel member 2080U2. The gate dielectric layer 254*d* wraps the nanostructures 2080N1, 2080N2, the middle dielectric layer 226M, and the barrier layers 207U2, 207M, 207L1 interposing therebetween. The gate dielectric layer 254*d* only directly interfaces the sidewall surfaces of the nanostructures 2080N1, 2080N2, and the middle dielectric layer 226M. The gate dielectric layer 254*d* wraps the bottom channel member 2080L1 and the barrier layers 207L1 and 207L2 that sandwich the bottom channel member 2080L1. The gate dielectric layer 254*d* only directly interfaces the sidewall surfaces of the bottom channel member 2080L1. The gate dielectric layer 254*d* wraps the bottom channel member 2080L2 and the barrier layers 207L2 and 207L3 that sandwich the bottom channel member 2080L2. The gate dielectric layer 254*d* only directly interfaces the sidewall surfaces of the bottom channel member 2080L2. The top surface of the gate electrode 254*f* may be substantially coplanar with the bottom surface of the middle dielectric layer 226M or substantially coplanar with the bottom surface of the bottom one in the pair of the barrier layers 207M. The bottom surface of the gate electrode 254*e* may be substantially coplanar with the top surface of the middle dielectric layer 226M or substantially coplanar with the top surface of the top one in the pair of the barrier layers 207M.

In the above embodiment represented by FIGS. 9A and 9B, in the Y-Z plane, sidewalls of the inner spacer features 226 are substantially straight. In other words, sidewalls of the barrier layers 207 and sidewalls of the gate dielectric layer 254*d* are flush. In an alternative embodiment represented by FIGS. 10A and 10B, in the Y-Z plane, edges of the barrier layers 207 may laterally intrude into the inner spacer features 226, such that edge portions of the barrier layers 207 are vertically between the inner spacer features 226 and the adjacent nanostructures 2080. Such a configuration may be due to uneven lateral recessing of the barrier layers 207 and the sacrificial layers 206 at block 110, in which the sacrificial layers 206 may be laterally recessed faster than the barrier layers 207.

Figures 11A, 11B:
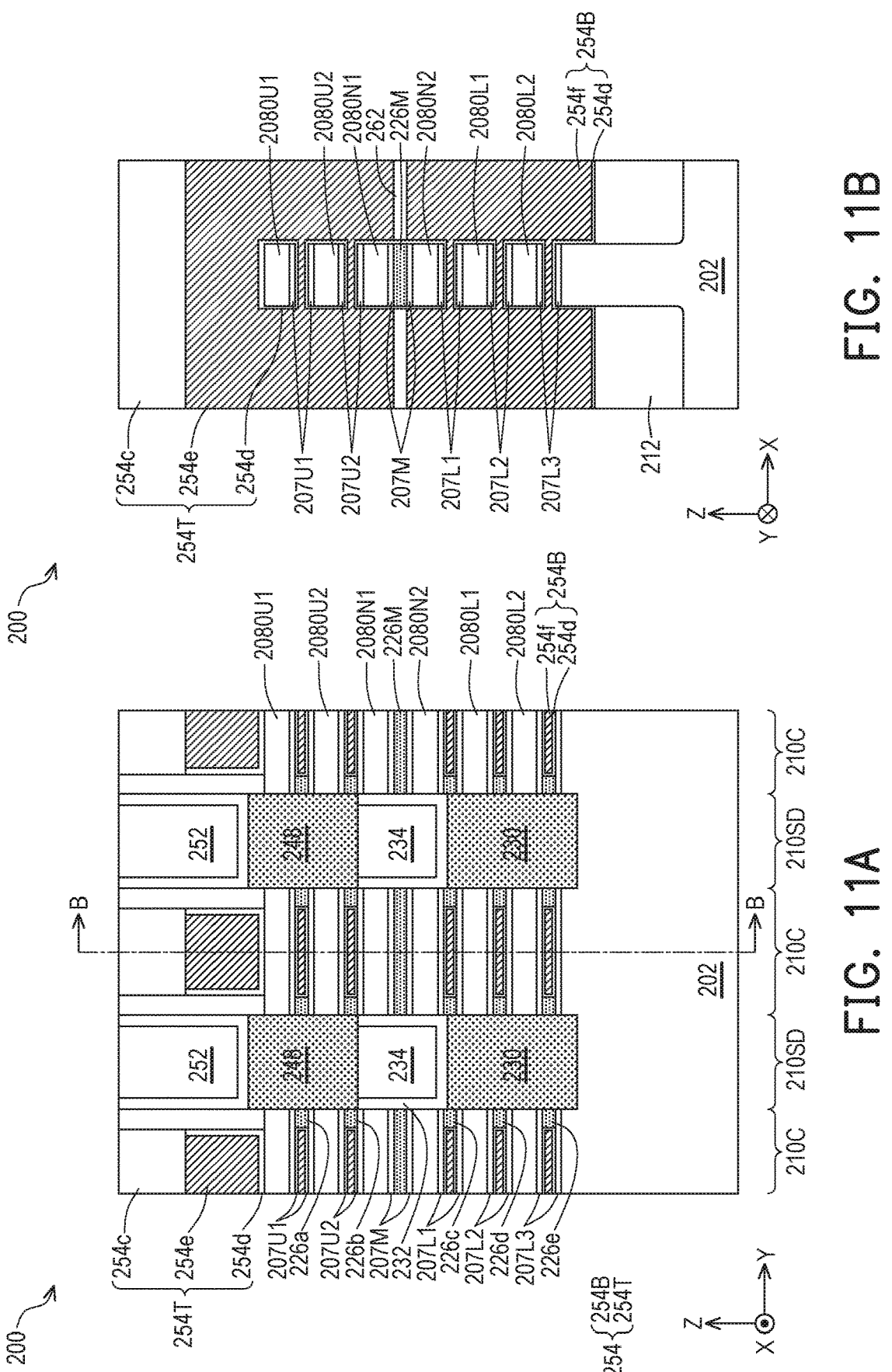

Alternatively, the barrier layers 207 may substantially remain intact during the lateral etching at block 110 depending on the etchants applied. Consequently, the barrier layers 207 may fully covers the top and bottom surfaces of the nanostructures 2080 and separate the inner spacer features 226 from the nanostructures 2080. Such an alternative embodiment is depicted by FIGS. 11A and 11B. Still further, the barrier layers 207U1 and 207U2 may be in physical contact with the top source/drain features 248, and the barrier layers 207L1, 207L2, and 207L3 may be in physical contact with the bottom source/drain features 230. Thus, the 2D material in the barrier layers 207 may provide a 2D channel for the flow of carriers. As the barrier layers 207 provide 2D channels extra to the 3D channels from the nanostructures 2080, the channel region 210C is also referred to as a hybrid channel region for including a combination of 3D channels from nanostructures 2080 and 2D channels from 2D material layers 207. Particularly, as discussed above, the barrier layers 207 may be doped with a dopant, such as sulfur (S), selenium (Se), tellurium (Te), zirconium (Zr), hafnium (Hf), tungsten (W), molybdenum (Mo), boron (B), oxygen (O), nitrogen (N), carbon (C), silicon (Si), or tin (Sn), to improve carrier mobility if function as 2D channels.

Figures 12A, 12B:
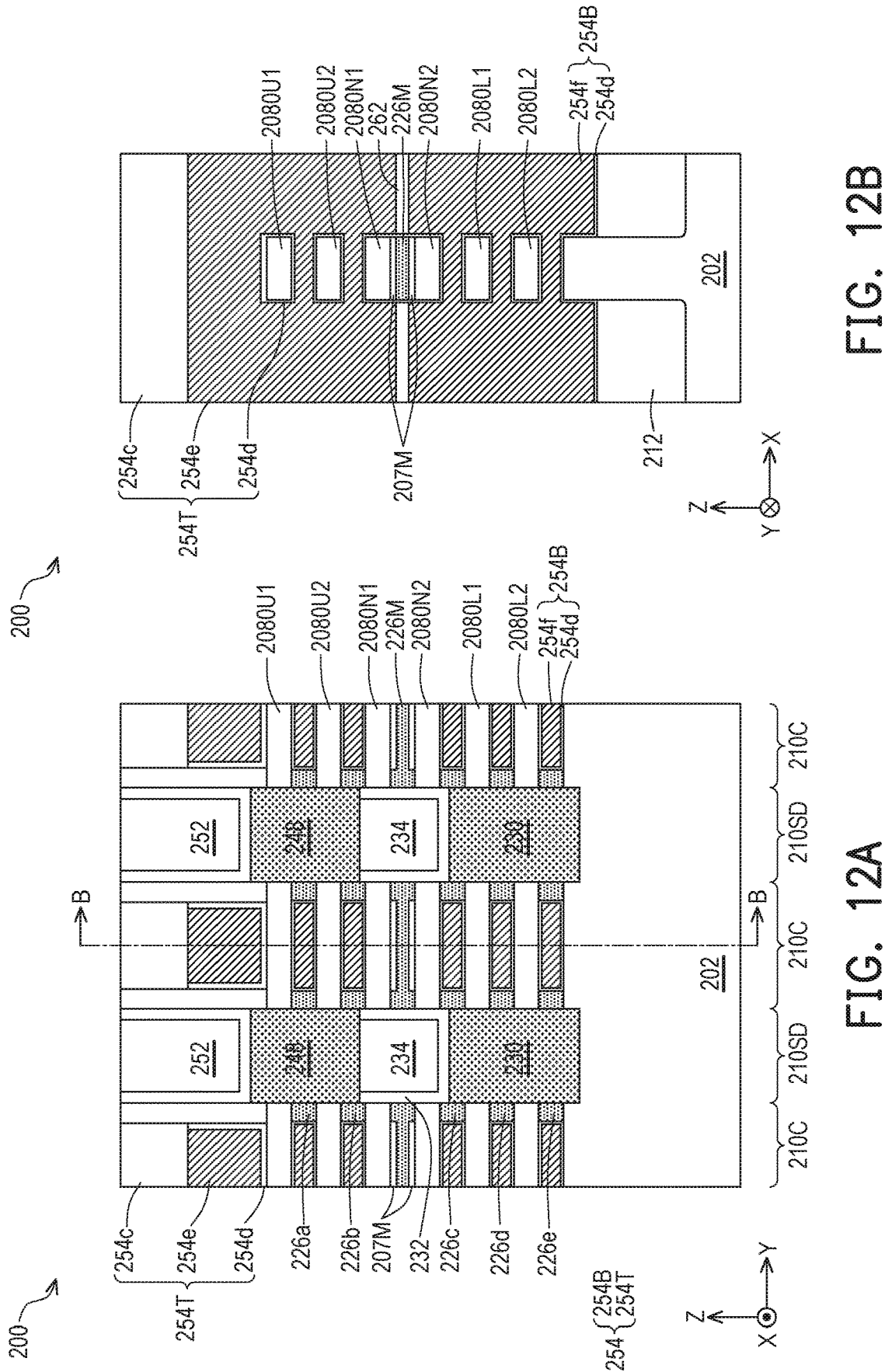

In the above embodiments represented by FIGS. 9A-11B, the barrier layers 207 remain substantially intact during the selective removal of the sacrificial layers 206 at block 122 due to etching selectivity. For example, for 2D materials such as hBN, CaF$_2$, GaS, and/or GaSe, which exhibit high etching selectivity with respect to SiGe, the barrier layers 207 may remain intact at block 122. In an alternative embodiment represented by FIGS. 12A and 12B, the barrier layers 207 may include 2D materials, such as graphene, MoS$_2$, MoSe$_2$, ReSe, ReS$_2$, WSe$_2$, and/or WS$_2$ that exhibit poor etching selectivity with respect to SiGe, and may be removed together with the sacrificial layers 206. Further, operations at block 122 may perform an additional etching process to selectively remove the barrier layers 207. By removing the barrier layers 207, the space between adjacent nanostructures 2080 is expanded, which facilitates the deposition of the gate structures 254 therebetween. Particularly, as shown in FIGS. 12A and 12B, the barrier layers 207U1, 207U2, 207L1, 207L2, and 207L3 are removed, while the barrier layers 207M remain substantially intact by being stacked between the middle dielectric layer 226M and the adjacent nanostructures 2080N1 and 2080N2 and not sufficiently exposed to etchants.

Although not intended to be limiting, one or more embodiments of the present disclosure provide many benefits to a semiconductor device and the formation thereof. For example, the present disclosure provides 2D material barrier layers disposed between channel layers and sacrificial layers in a superlattice structure to prevent intermixing therebetween, thereby improving the overall reliability of the semiconductor device.

In one exemplary aspect, the present disclosure is directed to a method. The method includes forming a stack over a substrate, the stack comprising a plurality of channel layers interleaved by a plurality of sacrificial layers and a plurality of two-dimensional (2D) material layers disposed between adjacent ones of the channel layers and the sacrificial layers, patterning the stack and a portion of the substrate to form a fin-shaped structure comprising a base portion formed from the substrate and a top portion formed from the stack, selectively removing the sacrificial layers of the top portion to form a plurality of channel members disposed over the base portion, forming a first gate structure wrapping around a bottom portion of the channel members, and forming a second gate structure above the first gate structure, the second gate structure wrapping around a top portion of the channel members. In some embodiments, the first gate structure and the second gate structure are of opposite conductivity types. In some embodiments, the forming of the stack includes depositing one of the 2D material layers, and epitaxially growing one of the channel layers or one of the sacrificial layers directly from a top surface of the one of the 2D material layers. In some embodiments, the depositing of the one of the 2D material layers is by a deposition process other than an epitaxy process. In some embodiments, the 2D material layers comprise graphene, hexagonal boron nitride, $CaF_2$, GaS, GaSe, or a transition metal dichalcogenide. In some embodiments, the 2D material layers comprise the transition metal dichalcogenide selected from the group of $MoS_2$, $MoSe_2$, $ReSe_2$, $ReS_2$, $WSe_2$, and $WS_2$. In some embodiments, at least one of the 2D material layers is a monolayer. In some embodiments, a middle one of the sacrificial layers includes a higher concentration of Ge than other ones of the sacrificial layers, and two of the 2D material layers directly interfacing top and bottom surfaces of the middle one of the sacrificial layers, respectively, have a larger thickness than other ones of the 2D material layers. In some embodiments, the method further includes prior to the selectively removing of the sacrificial layers, replacing a middle one of the sacrificial layers with a dielectric layer, wherein the dielectric layer has a dumbbell shape. In some embodiments, the selectively removing of the sacrificial layers includes removing a portion of the 2D material layers.

In another exemplary aspect, the present disclosure is directed to a method. The method includes epitaxially growing a plurality of first semiconductor layers and a plurality of second semiconductor layers on a substrate, the first semiconductor layers and the second semiconductor layers interleaving each other in a vertical direction, forming a plurality of barrier layers interposing adjacent ones of the first and second semiconductor layers, patterning the first and second semiconductor layers and the barrier layers to form a fin-shaped structure, replacing a middle one of the second semiconductor layers with a dielectric layer, the dielectric layer being sandwiched by two of the barrier layers, removing the second semiconductor layers above and under the dielectric layer, forming a first gate structure wrapping around a bottom portion of the first semiconductor layers under the dielectric layer, and forming a second gate structure wrapping around a top portion of the first semiconductor layers above the dielectric layer. In some embodiments, the barrier layers include a two-dimensional (2D) material. In some embodiments, the 2D material is selected from the group of graphene, hexagonal boron nitride, $CaF_2$, GaS, GaSe, $MoS_2$, $MoSe_2$, $ReSe_2$, $ReS_2$, $WSe_2$, and $WS_2$. In some embodiments, at least one of the barrier layers is a monolayer. In some embodiments, the two of the barrier layers sandwiching the dielectric layer are thicker than other ones of the barrier layers. In some embodiments, the method further includes lateral recessing the second semiconductor layers to form a plurality of cavities, and depositing a plurality of inner spacer features in the cavities, wherein the inner spacer features are in physical contact with the barrier layers. In some embodiments, an end portion of the barrier layers is vertically stacked between one of the inner spacer features and one of the first semiconductor layers.

In another exemplary aspect, the present disclosure is directed to a semiconductor device. The semiconductor device includes a plurality of first nanostructures, a lower source/drain feature abutting the first nanostructures, a first gate structure wrapping around each of the first nanostructures, a dielectric layer disposed above the first nanostructures, a plurality of second nanostructures disposed above the dielectric layer, an upper source/drain feature abutting the second nanostructures, a second gate structure wrapping around each of the second nanostructures, a first barrier layer directly interfacing a top surface of the dielectric layer, and a second barrier layer directly interfacing a bottom surface of the dielectric layer. In some embodiments, the first and second barrier layers comprise a two-dimensional (2D) material. In some embodiments, the semiconductor device further includes a third barrier layer directly interfacing a bottom surface of a topmost one of the second nanostructures, the second gate structure directly interfacing a top surface of the topmost one of the second nanostructures, and fourth and fifth barrier layers directly interfacing top and bottom surfaces of a bottommost one of the first nanostructures, respectively.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from spirit and scope of the present disclosure.

What is claimed is:

1. A method, comprising:
   forming a stack over a substrate, the stack comprising a plurality of channel layers interleaved by a plurality of sacrificial layers and a plurality of two-dimensional (2D) material layers disposed between adjacent ones of the channel layers and the sacrificial layers;
   patterning the stack and a portion of the substrate to form a fin-shaped structure comprising a base portion formed from the substrate and a top portion formed from the stack;
   selectively removing the sacrificial layers of the top portion to form a plurality of channel members disposed over the base portion;
   forming a first gate structure wrapping around a bottom portion of the channel members; and
   forming a second gate structure above the first gate structure, the second gate structure wrapping around a top portion of the channel members.

2. The method of claim 1, wherein the first gate structure and the second gate structure are of opposite conductivity types.

3. The method of claim 1, wherein the forming of the stack includes:

depositing one of the 2D material layers; and epitaxially growing one of the channel layers or one of the sacrificial layers directly from a top surface of the one of the 2D material layers.

4. The method of claim 3, wherein the depositing of the one of the 2D material layers is by a deposition process other than an epitaxy process.

5. The method of claim 1, wherein the 2D material layers comprise graphene, hexagonal boron nitride, $CaF_2$, GaS, GaSe, or a transition metal dichalcogenide.

6. The method of claim 5, wherein the 2D material layers comprise the transition metal dichalcogenide selected from the group of $MoS_2$, $MoSe_2$, $ReSe_2$, $ReS_2$, $WSe_2$, and $WS_2$.

7. The method of claim 1, wherein at least one of the 2D material layers is a monolayer.

8. The method of claim 1, wherein a middle one of the sacrificial layers includes a higher concentration of Ge than other ones of the sacrificial layers, and two of the 2D material layers directly interfacing top and bottom surfaces of the middle one of the sacrificial layers, respectively, have a larger thickness than other ones of the 2D material layers.

9. The method of claim 1, further comprising:

prior to the selectively removing of the sacrificial layers, replacing a middle one of the sacrificial layers with a dielectric layer, wherein the dielectric layer has a dumbbell shape.

10. The method of claim 1, wherein the selectively removing of the sacrificial layers includes removing a portion of the 2D material layers.

11. A method, comprising:

epitaxially growing a plurality of first semiconductor layers and a plurality of second semiconductor layers on a substrate, the first semiconductor layers and the second semiconductor layers interleaving each other in a vertical direction;

forming a plurality of barrier layers interposing adjacent ones of the first and second semiconductor layers;

patterning the first and second semiconductor layers and the barrier layers to form a fin-shaped structure;

replacing a middle one of the second semiconductor layers with a dielectric layer, wherein the dielectric layer is sandwiched by two of the barrier layers;

removing the second semiconductor layers above and under the dielectric layer;

forming a first gate structure wrapping around a bottom portion of the first semiconductor layers under the dielectric layer; and forming a second gate structure wrapping around a top portion of the first semiconductor layers above the dielectric layer.

12. The method of claim 11, wherein the barrier layers comprise a two-dimensional (2D) material.

13. The method of claim 12, wherein the 2D material is selected from the group of graphene, hexagonal boron nitride, $CaF_2$, GaS, GaSe, $MoS_2$, $MoSe_2$, $ReSe_2$, $ReS_2$, $WSe_2$, and $WS_2$.

14. The method of claim 11, wherein at least one of the barrier layers is a monolayer.

15. The method of claim 11, wherein the two of the barrier layers sandwiching the dielectric layer are thicker than other ones of the barrier layers.

16. The method of claim 11, further comprising:

lateral recessing the second semiconductor layers to form a plurality of cavities; and depositing a plurality of inner spacer features in the cavities, wherein the inner spacer features are in physical contact with the barrier layers.

17. The method of claim 16, wherein an end portion of the barrier layers is vertically stacked between one of the inner spacer features and one of the first semiconductor layers.

18. A semiconductor device, comprising:

a plurality of first nanostructures;

a lower source/drain feature abutting the first nanostructures;

a first gate structure wrapping around each of the first nanostructures;

a dielectric layer disposed above the first nanostructures;

a plurality of second nanostructures disposed above the dielectric layer;

an upper source/drain feature abutting the second nanostructures;

a second gate structure wrapping around each of the second nanostructures;

a first barrier layer directly interfacing a top surface of the dielectric layer; and a second barrier layer directly interfacing a bottom surface of the dielectric layer.

19. The semiconductor device of claim 18, wherein the first and second barrier layers comprise a two-dimensional (2D) material.

20. The semiconductor device of claim 18, further comprising:

a third barrier layer directly interfacing a bottom surface of a topmost one of the second nanostructures, wherein the second gate structure directly interfaces a top surface of the topmost one of the second nanostructures; and fourth and fifth barrier layers directly interfacing top and bottom surfaces of a bottommost one of the first nanostructures, respectively.

* * * * *